(12) United States Patent
Zhou et al.

(10) Patent No.: US 6,376,353 B1
(45) Date of Patent: Apr. 23, 2002

(54) ALUMINUM AND COPPER BIMETALLIC BOND PAD SCHEME FOR COPPER DAMASCENE INTERCONNECTS

(75) Inventors: Mei Sheng Zhou; Sangki Hong; Simon Chooi, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/609,167

(22) Filed: Jul. 3, 2000

(51) Int. Cl.[7] ............... H01L 21/44; H01L 21/4763; H01L 21/302
(52) U.S. Cl. .............. 438/612; 438/613; 438/614; 438/627; 438/634; 438/638; 438/687; 438/688; 438/706; 438/745
(58) Field of Search ................. 438/687, 688, 438/612–617, 627–629, 634, 637, 638–640, 700, 600, 706, 710, 738, 745

(56) References Cited

U.S. PATENT DOCUMENTS

| | | | |
|---|---|---|---|
| 5,702,979 A | * 12/1997 | Chan et al. | 438/612 |
| 5,785,236 A | 7/1998 | Cheung et al. | 228/180.5 |
| 5,923,955 A | 7/1999 | Wong | 438/108 |
| 5,985,765 A | 11/1999 | Hsiao et al. | 438/694 |
| 5,989,993 A | 11/1999 | Zakel et al. | 438/614 |
| 6,090,696 A | * 7/2000 | Jang et al. | 438/617 |

FOREIGN PATENT DOCUMENTS

JP    11-186390    * 7/1999

* cited by examiner

Primary Examiner—Ha Tran Nguyen
(74) Attorney, Agent, or Firm—George O. Saile; Rosemary L. S. Pike

(57) ABSTRACT

Improved processes for fabricating wire bond pads on pure copper damascene are disclosed by this invention. The invention relates to various methods of fabrication used for semiconductor integrated circuit devices, and more specifically to the formation of Al—Cu alloy top pad metal layers are described, which improve adhesion among the wire bond, top Al—Cu and the underlying copper pad metallurgy. This invention describes processes wherein a special Al—Cu bond layer or region is placed on top of the underlying copper pad metal. This Al—Cu bond pad on pure copper (with barrier layer in-between) provides for improved wire bond adhesion to the bond pad and prevents peeling during wire bond adhesion tests.

52 Claims, 7 Drawing Sheets

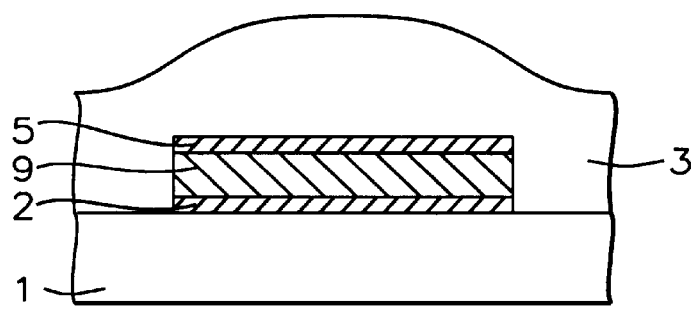
FIG. 1a – Prior Art
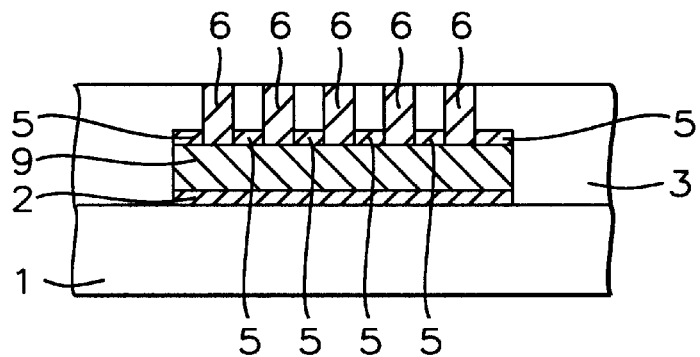
FIG. 1b – Prior Art
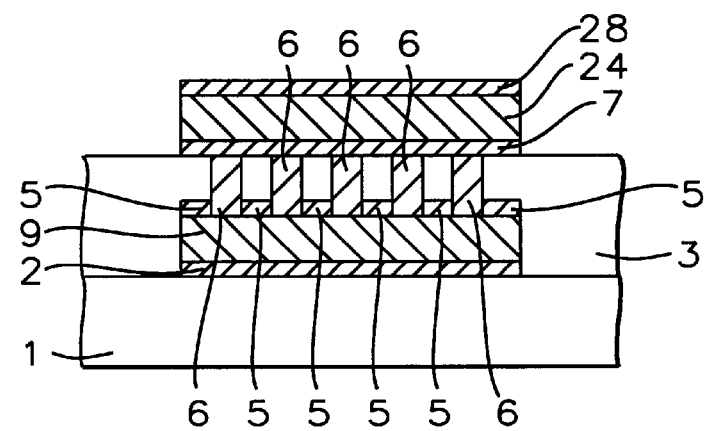
FIG. 1c – Prior Art

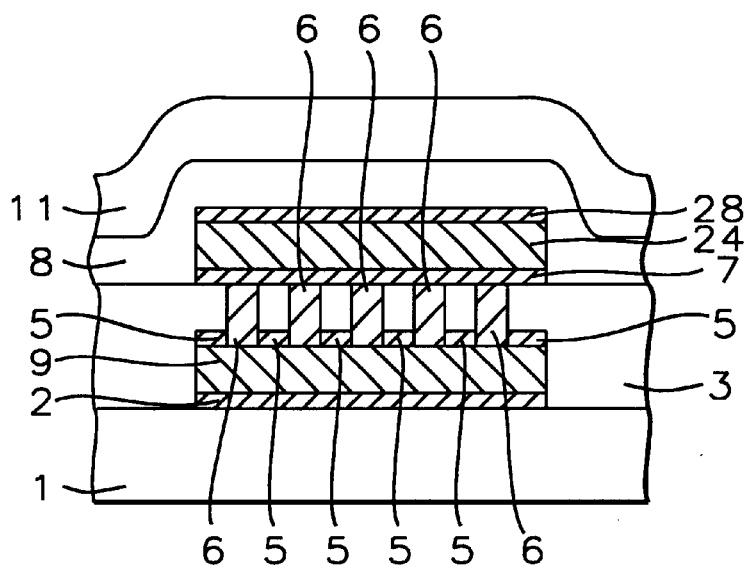
FIG. 1d — Prior Art
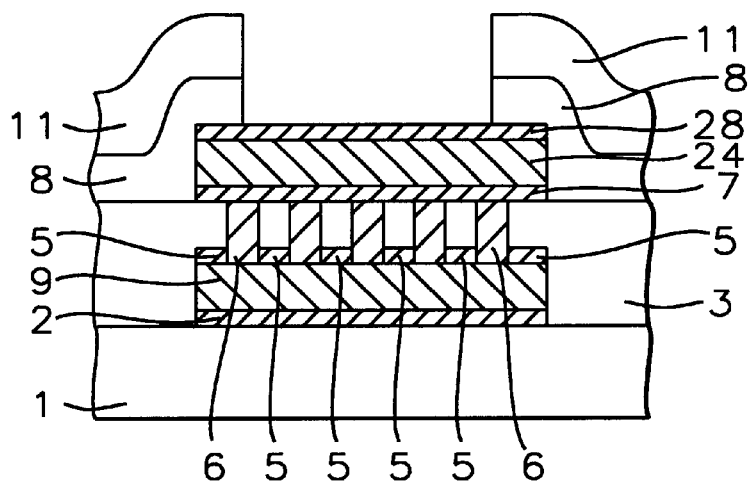
FIG. 1e — Prior Art

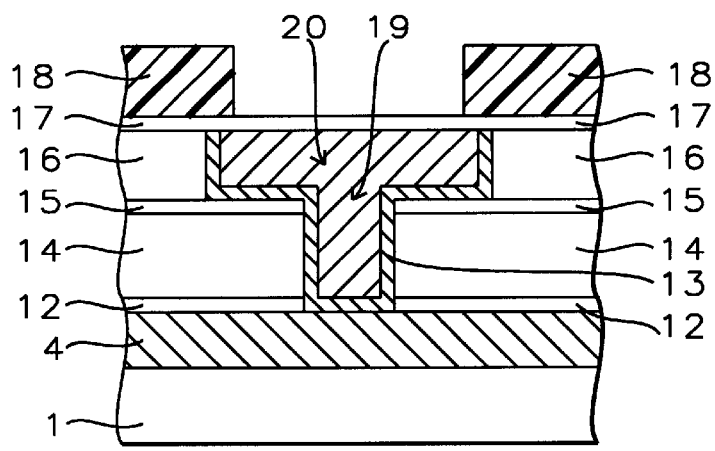
*FIG. 2a - Prior Art*
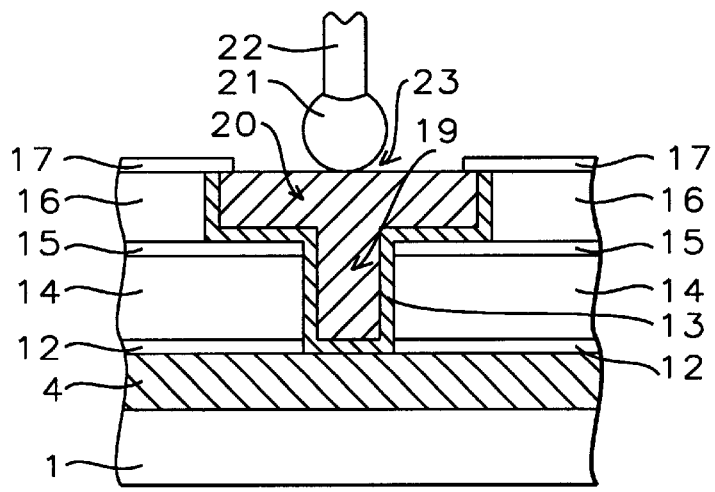
*FIG. 2b - Prior Art*
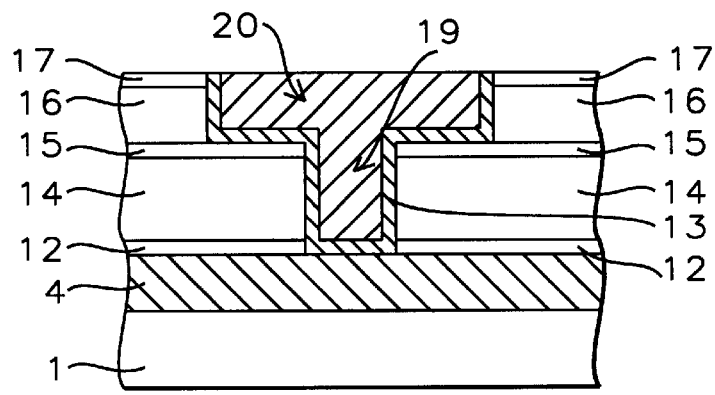
*FIG. 3a*

ALUMINUM AND COPPER BIMETALLIC BOND PAD SCHEME FOR COPPER DAMASCENE INTERCONNECTS

BACKGROUND OF THE INVENTION (1) Field of the Invention

It is the object of the present invention to provide processes wherein special Al—Cu bond layers or regions are placed on top of the underlying copper pad metal. These Al—Cu bond pads on pure copper (with barrier layer in-between) provide for improved wire bond adhesion to the bond pads and prevent peeling during wire bond adhesion tests.

(2) Description of Related Art

An important challenge in the fabrication of wire bond pads is to have good adhesion and compatibility of the various metal layers in dual damascene processing. The damascene processing is a "standard" method for fabricating planar copper interconnects. Damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices. In both examples, sputtered Ti/TiN liners, underlying diffusion barriers, have been coated with chemical vapor deposited (CVD) W metal, then polished back to oxide.

In the dual-damascene process, a monolithic stud/wire structure is formed from the repeated patterning of a single thick oxide film followed by metal filling and CMP. First, a relatively thick oxide layer is deposited on a planar surface. The oxide thickness is slightly larger than the desired final thickness of the stud and wire, since a small amount of oxide is removed during CMP. Stud recesses are formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes.

Next, the stud/wire metallization is deposited, then planarized using CMP. The resulting interconnects are produced with fewer process steps than with conventional processing and with the dual damascene process, two layer of metal are formed as one, i.e., wiring line and contact stud vias, avoiding an interface between the layers.

Another metal deposition, besides sputtering techniques, has been adapted as a standard for copper metallization. This technique is electrochemical deposition (ECD) of copper. The electrochemical copper deposition (ECD) still needs, e.g., sputtering techniques, physical vapor deposition (PVD), to deposit thin underlying diffusion barrier film (Ta,TaN) and a conductive "seed" layer of copper.

The key points of Prior Art for copper dual damascene wire bonding, are that poor wire bonding occurs at the bond when bonding directly to pure copper. Brittle intermetallic compounds form directing between the lead-tin solder and the pure copper metal, among others that are possible, e.g., $Cu_3Sn_5$, $CuSn_3$. Another reason for difficulty in wire bonding to the pure copper, is that the copper oxide does not form a passivating oxide and spalls or flakes off. Some metals, e.g., aluminum oxide $Al_2O_3$, $Cr_2O_3$, NiO, CoO, and insulating $SiO_2$, form dense, passivating oxide, while copper oxide has a Pilling-Bedworth ratio much greater than one and forms oxides that are non-protecting, making the pure copper surface easy to oxidize and less noble than the other materials. Standard wire bond pull strengths are reduced to unacceptable levels resulting in spalling, peeling and fracture of the wire bond at the Cu/Pb-Sn interface, by the pure copper dual damascene Prior Art methods. As an example of goodness, needed for good results in wire bond tensile strength tests, is that the wire itself is broken, at tensile force levels approaching the tensile strength of the appropriate wire, and not at the wire bond itself.

Related Prior Art background patents will now be described in this section.

U.S. Pat. No. 5,989,993 entitled "Method for Galvanic Forming of Bonding Pads" granted Nov. 23, 1999 to Zakel et al. describes a plating process for a bonding pad. A method for the preparation of electrodeposited or galvanically deposited bumps for the bonding of integrated circuits is shown. It is characterized by two subsequent metal depositions, deposited without an external current source (chemical metal deposition) on a metallization.

U.S. Pat. No. 5,785,236 entitled "Advanced Copper Interconnect System That Is Compatible With Existing IC Wire Bonding Technology" granted Jul. 28, 1998 to Cheung et al. describes a copper bonding pad process. A process is provided which enables electrical connection to be formed between gold and aluminum wires and copper interconnects. Conventional techniques for wire bonding are ineffective for bonding gold wires or aluminum wires to copper pads or copper interconnects. The patent describes a process whereby an aluminum pad is formed over the copper interconnects. Metal wire is then bonded to the aluminum pad using conventional wire bonding techniques.

U.S. Pat. No. 5,985,765 entitled "Method For Reducing Bonding Pad Loss Using a Capping Layer When Etching Bonding Pad Passivation Openings" granted Nov. 16, 1999 to Hsiao et al. teaches a bonding pad with an overlying capping layer. A method for reducing bonding pad loss is described using a capping layer when contact openings are etched to the bonding pads, while concurrently etching much deeper fuse openings to the substrate. Bonding pads are used on the top surface of integrated circuit semiconductor chips to provide external electrical connections for I/Os and power. Fusible links are used in the underlying insulating layers to remove redundant defective circuit elements, and thereby, repair defective chips. It is desirable (cost effective) to etch the contact openings in the passivation layer to the bonding pads near the top surface on the chip and to concurrently etch the much deeper fuse openings in the thick underlying insulating layers over the fuses. However, because of the difference in etch depth of the two types of openings, the bonding pads composed of Al/Cu are generally overetched causing bond-pad reliability problems. This invention describes a process in which a capping layer, having a low etch rate, is formed on the bonding pads to prevent overetching, while the fuse openings are etched to the desired depth in the thicker insulating layers.

U.S. Pat. No. 5,923,955 entitled "Fine Flip Chip Interconnection" granted Jul. 13, 1999 to Wong shows a multilayed bonding pad. There is disclosed a process for creating a flip chip bonded combination for a first integrated circuit and a second integrated circuit. Creating a first connection means on each bonding pad of a first integrated circuit within a first wall structure and a second connection means on each bonding pad of a second integrated circuit within a second wall structure. Removing the second wall structure and partially placing each second connection means within the first wall structure over a respective connection means of the first integrated circuit.

SUMMARY OF THE INVENTION

It is the object of the present invention to provide processes wherein special Al—Cu bond layers or regions are placed on top of the underlying copper pad metal. These Al—Cu bond pads on pure copper (with barrier layer in-between) provide for improved wire bond adhesion to the bond pads and prevent peeling during wire bond adhesion tests.

The first embodiment of the present invention is now summarized, the first method of formation for an Al—Cu alloy top bond pad region for subsequent wire bonding. Provided is a dual copper damascene processing scheme and structure in intermetal dielectric (IMD) layers, with copper metallurgy within and wiring underneath, on a provided semiconductor substrate. Excess copper is polished back by chemical mechanical polishing (CMP), using a passivating cap layer, e.g., silicon nitride, as a CMP stop layer. Selective wet etching of the top layer of copper is performed by a DMSO/$CCl_4$ solution. This wet etching step yields a recessed top metal copper layer. A hydrogen or ammonia plasma is performed to remove any copper oxide on the top copper layer. Next, a barrier layer is deposited by either a physical vapor deposition (PVD) method or a chemical vapor deposition (CVD). A blanket layer of AlCu alloy metal is deposited by physical vapor deposition (PVD) sputtering the AlCu film. Patterning of the Al—Cu film and barrier layer is performed, wherein, the Al—Cu and barrier layer is reactive ion etched back (RIE) using $Cl_2$/$BCl_3$ chemistry, stopping on the silicon nitride cap. Alternately, the Al—Cu and barrier layer, TiN, is polished back using chemical mechanical polishing (CMP), stopping on the silicon nitride cap. The end result of the first embodiment of this invention is an Al—Cu bond pad on top of the entire dual damascene copper (barrier layer in between), interconnect trench and via. The top Al—Cu bond pad layer can now be soldered without the need for further passivation.

The second embodiment of the present invention is now summarized, the first method of formation for an Al—Cu alloy top bond pad region for subsequent wire bonding. Provided is a dual copper damascene processing scheme and structure in intermetal dielectric (IMD) layers, with copper metallurgy within and wiring underneath, on a provided semiconductor substrate. Excess copper is polished back by chemical mechanical polishing (CMP), using a passivating cap layer, e.g., silicon nitride, as a CMP stop layer. A lithography step patterns photoresist and the top copper is wet etched by DMSO/$CCl_4$ to form a patterned recessed copper layer. The photoresist is stripped using an oxygen plasma ash step or using a solvent stripper. Next, an optional hydrogen or ammonia gas plasma treatment is used to remove any copper oxide on the surface. Barrier metal is deposited using chemical vapor deposition (CVD) or physical vapor deposition (PVD). Following the barrier metal deposition, a layer of Al—Cu alloy metal is deposited. Patterning of the Al—Cu film and barrier layer is performed, wherein the Al—Cu and barrier layer is reactive ion etched back (RIE) using $Cl_2$/$BCl_3$ chemistry, stopping on the silicon nitride cap. Alternately, the Al—Cu and barrier layer is polished back using chemical mechanical polishing (CMP), stopping on the silicon nitride cap. The end result of the second embodiment of this invention is an Al—Cu bond pad centrally located over the dual damascene copper (barrier layer in between), interconnect trench and contact via. The top Al—Cu bond pad layer can now be soldered without the need for further passivation.

The third embodiment of the present invention is now summarized, the first method of formation for an Al—Cu alloy top bond pad region for subsequent wire bonding. Provided is a dual copper damascene processing scheme and structure in intermetal dielectric (IMD) layers, with copper metallurgy within and wiring underneath, on a provided semiconductor substrate. Excess copper is polished back by chemical mechanical polishing (CMP), stopping on an intermetal dielectric (IMD) layer. A passivating layer of silicon nitride is blanket deposited over the substrate and covers the top surface of copper and intermetal dielectric (IMD). Next, a lithography step patterns photoresist, which patterns the silicon nitride passivating layer. The passivating nitride is reactive ion etched (RIE). In addition, the top copper is patterned, wherein the top copper is reactive ion etched (RIE), or wet etched, to form a patterned recessed copper layer. Next, the photoresist is stripped using an oxygen plasma ash step or using a solvent stripper. A hydrogen or ammonia gas plasma is used to remove any copper oxide on the copper surface. Barrier metal is deposited using chemical vapor deposition (CVD) or physical vapor deposition (PVD). Following the barrier metal deposition, a layer of Al—Cu alloy metal is deposited, forming the start of an Al—Cu bonding pad region. Patterning of the Al—Cu film and barrier layer is performed, wherein is the Al—Cu and barrier layer is reactive ion etched back (RIE) using $Cl_2$/$BCl_3$ chemistry, stopping on the silicon nitride passivating layer. Alternately, the Al—Cu and barrier layer is polished back using chemical mechanical polishing (CMP), stopping on the silicon nitride passivating layer. The end result of the third embodiment of this invention is an Al—Cu bond pad, planar and centrally located planar over the dual damascene copper (barrier layer in between), interconnect trench and contact via. The top Al—Cu bond pad layer can now be soldered without the need for further passivation.

The processes of the present invention fabricate Al—Cu wire bonding pads that have good adhesion properties (no metal interface separation/peel failures or interface fracture failures). Since there are a large statistical number of these structures, failure rates are very low and show a high reliability, as tested by gold wire bond pull tests. Temperature and humidity cycling tests also indicate the robustness of the processes of this invention, free from stress-crack corrosion, peeling, interface failure, adhesion failures.

In summary, for all three main embodiments of the present invention, the top Al—Cu bond pad layer can be soldered without the need for further passivation. At the aluminum copper alloy interface is protected from the pure copper below by the barrier layer.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIGS. 1A–1E, which in cross-sectional representation illustrate a Prior Art method of fabrication.

FIGS. 2A–2B, which in cross-sectional representation illustrate another Prior Art method.

FIGS. 3A–3D, which in cross-sectional representation, illustrate the method of the first embodiment of the present invention, the formation of an Al—Cu top bond pad region for subsequent wire bonding.

DESCRIPTION OF THE PREFERRED EMBODIMENTS

Figure 3B:
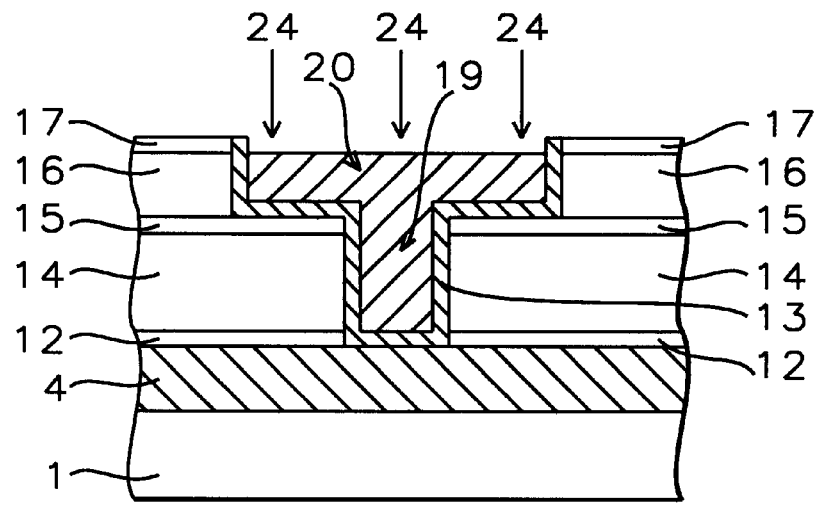

This invention relates to various methods of fabrication used for semiconductor integrated circuit devices, and more specifically to the formation of Al—Cu alloy top pad metal layers are described which improve adhesion among the wire bond, top Al—Cu and the underlying copper pad metallurgy. It is the object of the present invention to provide processes wherein a special Al—Cu bond layer or region is placed on top of the underlying copper pad metal. This Al—Cu bond pad on pure copper provides for improved wire bond adhesion to the bond pad and prevents peeling during wire bond adhesion tests.

Referring to FIGS. 1a–1e, which in cross-sectional representation illustrate a Prior Art method of fabrication. More specifically, referring to FIG. 1a, illustrated in cross-sectional drawing, provided is a conventional process scheme to fabricate AlCu alloy metallurgy bond pads with AlCu alloy wiring underneath. Provided in FIG. 1a is a semiconductor substrate 1. The substrate is preferably composed of mono-crystalline silicon with semiconductor device structures, such as, gate electrodes, source and drain regions, metal interconnects, contact holes and vias (not shown in Figs.) and materials, such as, insulators and metals, formed on or in the semiconductor substrate. An AlCu metal alloy interconnect 9 is deposited over a formed Ti/TiN layer 2, followed by a conductive TiN anti-reflective coating (ARC) layer 5. The Ti/TiN/AlCu/TiN ARC "stack", is then patterned. In addition, an insulating layer of dielectric 3, is blanket deposited over the substrate and over the TiN anti-reflective coating (ARC) layer 5.

Referring to FIG. 1b, illustrated in cross-sectional drawing, is a continuation of the Prior Art method of fabrication. As shown in FIG. 1b, the insulating layer of dielectric layer 3, or dielectric layer 3, is planarization by chemical mechanical polishing (CMP), followed by W plug formation, wherein patterned conductive tungsten plugs 6 are formed.

Referring to FIG. 1c, illustrated in cross-sectional drawing, is a continuation of the Prior Art method of fabrication. As shown in FIG. 1c, interconnect/bond pads are fabricated, which consist of the addition of patterned layers of a Ti/TiN layer 7 over the W plugs 6, an AlCu layer 24 over the Ti/TiN layer 7, and a TiN anti-reflective coating (ARC) layer 28 over the AlCu layer 24.

Referring to FIG. 1d, illustrated in cross-sectional drawing, is a continuation of the Prior Art method of fabrication. As shown in FIG. 1d, two layers of insulator are blanket deposited over the substrate for passivation. First, a blanket layer of silicon oxide or silicon dioxide 8 is deposited over the substrate and the TiN ARC layer 28. Next, a blanket layer of silicon nitride or SiN 11 is deposited over the substrate and the silicon dioxide layer 8.

Referring to FIG. 1e, illustrated in cross-sectional drawing, is a continuation of the Prior Art method of fabrication. As shown in FIG. 1e, patterning and etching of a bond pad opening is depicted. Etching takes place through the two layers of insulator and the TiN ARC layer 28, to open the bond pad region, for subsequent bonding to the AlCu layer 24.

Referring to FIG. 2a, which in cross-sectional representation illustrates another method of Prior Art. More specifically, referring to FIG. 2a, illustrated in cross-sectional drawing, provided is a conventional copper damascene scheme to fabricate copper metallurgy bond pads with copper metallurgy, wiring underneath. Provided in FIG. 2a is a semiconductor substrate 1, preferably composed of mono-crystalline silicon with semiconductor device structures, such as, gate electrodes, source and drain regions, metal interconnects, damascene interconnects, contact holes and vias (not shown) may be formed in and on the semiconductor substrate. The semiconductor substrate may also contain dielectric and insulating layers (not shown), such as, silicon nitride and silicon dioxide. A copper metal interconnect 4 is deposited and patterned embedded within a provided insulating layer (not shown in Figs.). In addition, two insulating layers of dielectric, a first intermetal dielectric (IMD) 14, and a second intermetal dielectric (IMD) 16, are deposited and patterned into a trench (gap) and via openings for copper bond pad and interconnect 20 and connect via 19, in FIG. 2a. Also in FIG. 2a for completeness, provided are following layers: patterned passivation layer 12, a patterned etch stop (process option) layer 15, patterned conductive first metal barrier layer 13, which is a trench and via liner, and a patterned top layer of photoresist 18. Provided in FIG. 2A is a dual damascene structure, via 19 and interconnect 20. The typical insulating dielectric material is silicon oxide type compounds. Deposited and patterned into the first 14 and second insulating layer 16, intermetal dielectrics (IMD), is a copper bond metal 20, top bond pad metal, and connect via 19, excess copper metal polished back by chemical mechanical polishing (CMP). A passivating blanket layer 17, e.g., silicon nitride, is provided and covers the top layer of copper metal and is underneath the top layer of photoresist 18, in FIG. 2a.

Referring to FIG. 2b, illustrated in cross-sectional drawing, provided is a continuation of the processing described above in FIG. 2a, that is, a conventional copper damascene scheme to fabricate copper metallurgy bond pads with copper wiring underneath. The elements are the same and labeled the same, with the following exceptions and extension of the Prior Art methods. The passivating blanket layer 17, e.g., silicon nitride, is patterned and subsequently etched 17, shown in FIG. 2b, by the photoresist 18, previously shown in FIG. 2a. The photoresist is stripped off near and around the bond pad area. In FIG. 2b, gold wire 22, with lead-tin alloy solder ball 21, is wire bonded 23 to the copper bond pad area, copper interconnect 20 and via 19.

The key points of Prior Art copper wire bonding are that poor wire bonding occurs at the bond 23, in FIG. 2b, with brittle intermetallic compounds forming directing between the lead-tin solder and the pure copper metal, among others that are possible, e.g., $Cu_3Sn_5$, $CuSn_3$. Another reason for difficulty in wire bonding to the pure copper, is that the copper oxide does not form a passivating oxide and spalls or flakes off. Some metals, e.g., aluminum oxide $Al_2O_3$, $Cr_2O_3$, NiO, CoO, and insulating $SiO_2$, form dense, passivating oxide, while copper oxide has a Pilling-Bedworth ratio much greater than one and forms oxides that are non-protecting, making the pure copper surface easy to oxidize and less noble than the other materials. Standard wire bond pull strengths are reduced to unacceptable levels resulting in spalling, peeling and fracture of the wire bond at the Cu/Pb-Sn interface, by the pure copper dual damascene Prior Art method. As an example of goodness, needed for good results in wire bond tensile strength tests, is that the wire itself is broken, at tensile force levels approaching the tensile strength of the appropriate wire, and not at the wire bond itself.

Referring to FIGS. 3a–3d, which in cross-sectional representation illustrates the first embodiment of the present invention. More specifically, referring to FIG. 3a, illustrated in cross-sectional drawing, provided is the start of a copper damascene scheme with copper metallurgy, wiring underneath. Provided in FIG. 3a is a semiconductor substrate 1, preferably composed of mono-crystalline silicon with semiconductor device structures, such as, gate electrodes, source and drain regions, metal interconnects, damascene interconnects, contact holes and vias (not shown) may be formed in and on the semiconductor substrate. The semiconductor substrate may also contain dielectric and insulating layers (not shown), such as, silicon nitride and silicon dioxide. A copper interconnect 4 is deposited and patterned embedded within a provided insulating layer (not shown in FIGS.). Although a single copper layer is depicted in FIG. 3a, it should be understood by those skilled in the art that the copper layer could be a dual damascene copper interconnect or a single damascene copper interconnect. In addition, two insulating layers of dielectric, a first intermetal dielectric (IMD) 14, and a second intermetal dielectric (IMD) 16, are deposited and patterned into a trench (gap) and via openings for copper bond pad and interconnect 20 and connect via 19. As shown in FIG. 3a, interposed between the first level of wiring 4 and first intermetal level dielectric 14, is a deposited and patterned passivation layer 12. In addition, interposed between first intermetal dielectric (IMD) 14 layer and the second intermetal dielectric (IMD) 16 layer, is a deposited and patterned etch stop (process option) layer 15. Also in FIG. 3a for completeness, provided are following layers: patterned passivation layer 12, a patterned etch stop (process option) layer 15, first conductive metal barrier layer 13, which is a trench and via liner, and a cap layer 17. The typical insulating dielectric material consists of, but is not restricted to, doped and undoped silicon oxide type compounds or low dielectric constant organic polymers. After the deposition of the first barrier metal layer 13 and copper into the trench 20 and via 19, the excess copper and barrier metal are polished back by chemical mechanical polishing (CMP) stopping on the cap layer 17. The cap layer (17) includes, but is not restricted to, silicon nitride, silicon oxynitride, silicon carbide and boron nitride, but is preferably composed of silicon nitride and is of a thickness from about 500 to 6000 Angstroms.

Referring to FIG. 3b, illustrated in cross-sectional drawing, provided is a continuation of the processing described above in FIG. 3a, describing the first embodiment of the present invention. Selective wet etching of the top layer of copper 20 is performed by a DMSO/CCl$_4$ solution, dimethylsulfoxide, carbon tetrachloride. This wet etching step yields a recessed top metal copper layer 24. Some of the process details and specifications for this etching step, are as follows. The etch solutions is DMSO/CCl$_4$ solution, dimethylsulfoxide, carbon tetrachloride, in a temperature range between 20 to 150° C., for an etch rate range between 5 to 100 Angstroms per minute, in an etch time of between 1 to 60 minutes, for a copper removal between about 100 to 8000 Angstroms. Other chemical solutions for this wet etching step include one or more of the following group, consisting of hydrofluoric acid (HF), acetic acid (CH$_3$COOH), ammonium fluoride (NH$_4$F), tetramethylammonium hydroxide (TMAH), tetraethylammonium hydroxide (TEAH), tetrapropylammonium hydroxide (TPAH), benzotriazole, surfactant and water. The preferred etch solution mixtures include: NH$_4$F/CH$_3$COOH, HF/NH$_4$F/H$_2$O, HF/NH$_4$F/H$_2$O/surfactant, and TMAH/H$_2$O.

Figure 3C:
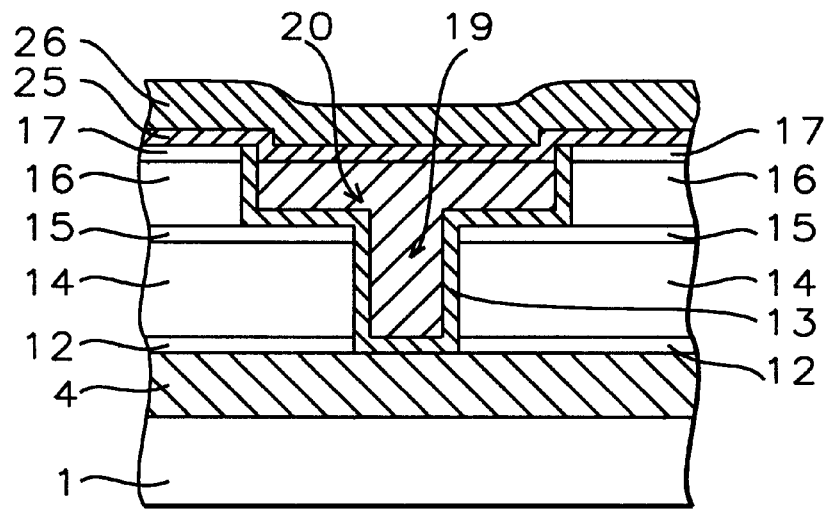

Referring to FIG. 3c, illustrated in cross-sectional drawing, provided is a continuation of the processing described above in FIG. 3b, describing the first embodiment of the present invention. Firstly, a hydrogen or ammonia plasma is performed to remove any copper oxide on the top copper layer 20. This plasma treatment can be performed in a separate piece of equipment or in-situ within the barrier metal deposition system, prior to the deposition of the barrier metal. Next, a second barrier layer 25 is deposited by either a physical vapor deposition (PVD) method or a chemical vapor deposition (CVD) to a thickness from about 20 to 5000 Angstroms. The barrier metal includes, but is not limited to, the following materials: tantalum (Ta), tantalum nitride (TaN), titanium nitride (TiN), and tungsten nitride (WN). A blanket layer of AlCu alloy metal is deposited by physical vapor deposition (PVD) sputtering the AlCu film 26 for a film thickness from about 2,000 to 20,000 Angstroms.

Figure 3D:
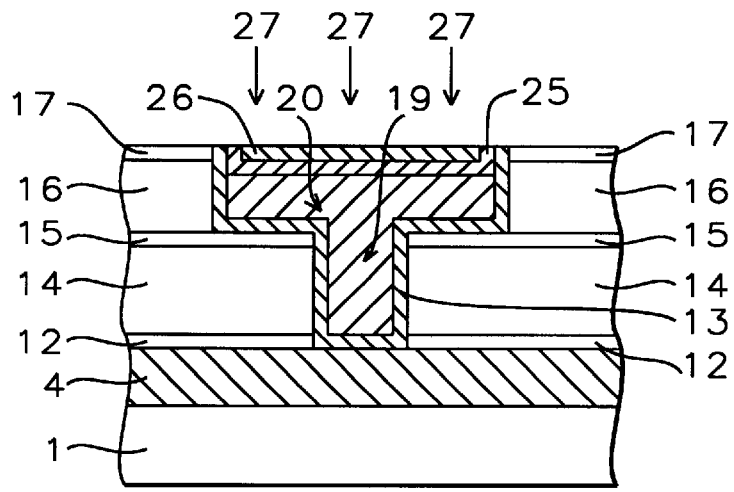

Referring to FIG. 3d, illustrated in cross-sectional drawing, provided is a continuation of the processing described above in FIG. 3c, describing the first embodiment of the present invention. Patterning of the Al—Cu film 26 and barrier layer, TiN, is performed, wherein the Al—Cu and barrier layer, TiN, is reactive ion etched back (RIE) using Cl$_2$/BCl$_3$ chemistry stopping on the silicon nitride cap 17. Alternately, the Al—Cu and barrier layer, TiN, is polished back using chem-mechanical polishing (CMP), stopping on the silicon nitride cap 17. The end result of the first embodiment of this invention is an Al—Cu bond pad 27, shown in FIG. 3d. The top Al—Cu bond pad layer 27 can now be soldered without the need for further passivation.

Figure 4A:
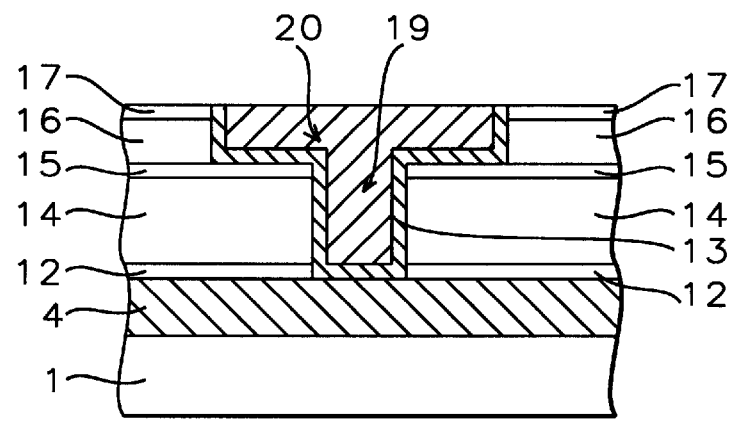
FIGS. 4A–4D, which in cross-sectional representation, illustrate the method of the second embodiment of the present invention, the formation of an Al—Cu top bond pad region for subsequent wire bonding.

Referring to FIGS. 4a–4d, which in cross-sectional representation illustrates the second embodiment of the present invention. More specifically, referring to FIG. 4a, illustrated in cross-sectional drawing, provided is the start of a copper damascene scheme with copper metallurgy, wiring underneath. Provided in FIG. 4a is a semiconductor substrate 1, preferably composed of mono-crystalline silicon with semiconductor device structures, such as, gate electrodes, source and drain regions, metal interconnects, damascene interconnects, contact holes and vias (not shown) may be formed in and on the semiconductor substrate. The semiconductor substrate may also contain dielectric and insulating layers (not shown), such as, silicon nitride and silicon dioxide. A copper interconnect 4 is deposited and patterned embedded within a provided insulating layer (not shown in Figs.). Although a single copper layer is depicted in FIG. 4a, it should be understood by those skilled in the art that the copper interconnect (4) could be part of a dual damascene or a single damascene interconnect scheme. In addition, two insulating layers of dielectric, a first intermetal dielectric (IMD) 14, and a second intermetal dielectric (IMD) 16, are deposited and patterned into a trench (gap) and via openings for copper bond pad and interconnect 20 and connect via 19. As shown in FIG. 4a, interposed between the first level of wiring 4 and first intermetal level dielectric 14, is a deposited and patterned passivation layer 12. In addition, interposed between first intermetal dielectric (IMD) 14 layer and the second intermetal dielectric (IMD) 16 layer, is a deposited and patterned etch stop (process option) layer 15. Also in FIG. 4a for completeness, provided are following layers: patterned passivation layer 12, a patterned etch stop (process option) layer 15, first conductive metal barrier layer 13, which is a trench and via liner, and a cap layer 17. The typical insulating dielectric material consists of, but is not restricted to, doped and undoped silicon oxide type compounds, or low dielectric constant organic polymers. After the deposition of both the first barrier metal layer 13 and copper into the trench 20 and via 19 regions, the excess copper and barrier metal are polished back by chemical mechanical polishing (CMP), stopping on the cap layer 17. The cap layer (17) includes, but is not restricted to, silicon nitride, silicon oxynitride, silicon carbide and boron nitride, but is preferably composed of silicon nitride and is of a thickness from about 500 to 6000 Angstroms.

Figure 4B:
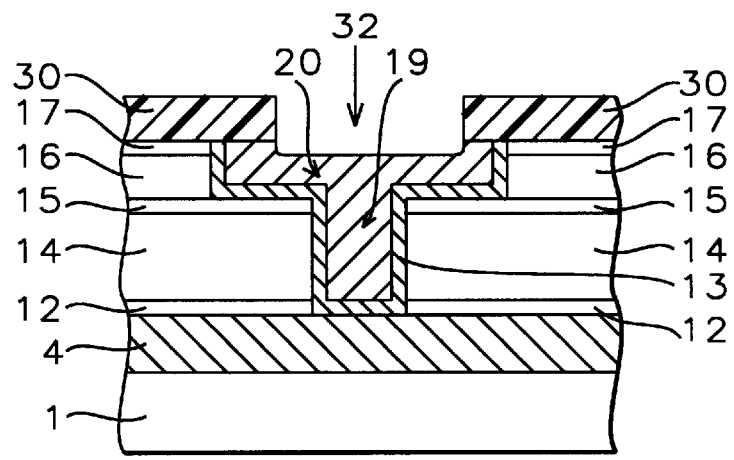

Referring to FIG. 4b, illustrated in cross-sectional drawing, provided is a continuation of the processing described above in FIG. 4a, describing the second embodiment of the present invention. A lithography step patterns photoresist 30 and the top copper 20 is wet etched by using one or more of the following chemicals, to form a patterned recessed copper layer 32: dimethylsulfoxide (DMSO), carbon tetrachloride ($CCl_4$), hydrochloric acid (HCl), hydrofluoric acid (HF), acetic acid ($CH_3COOH$), ammonium fluoride ($NH_4F$), tetramethylammonium hydroxide (TMAH), tetraethylammonium hydroxide (TEAH), tetrapropylammonium hydroxide (TPAH), benzotriazole, surfactant and water. Some of the preferred etch solution mixtures include: $DMSO/CCl_4$, $TMAH/H_2O$, $NH_4F/CH_3COOH$, $HF/NH_4F/H_2O$, dilute HF, and $HF/NH_4F/H_2O$/surfactant. The amount of copper that is removed is about 100 to 8000 Angstroms.

Figure 4C:
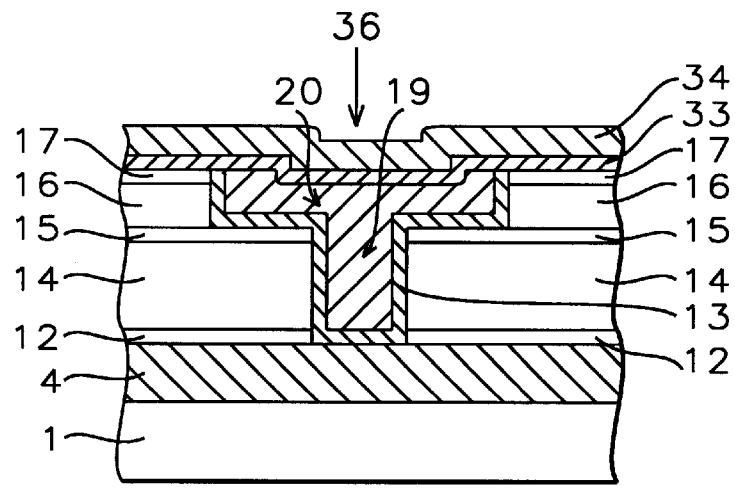

Referring to FIG. 4c, illustrated in cross-sectional drawing, provided is a continuation of the processing described above in FIG. 4b, describing the second embodiment of the present invention. The photoresist is stripped using an oxygen plasma ash step or using a solvent stripper. Next, a hydrogen or ammonia gas plasma is used to remove any copper oxide on the surface. Barrier metal 33 or second barrier metal layer, is deposited using physical vapor deposition (PVD), sputtering, or by chemical vapor deposition (CVD), to a thickness from about 20 to 5000 Angstroms. Following the barrier metal deposition, a layer of Al—Cu alloy metal 34 is deposited to a thickness of 2,000 to 20,000 Angstroms. The second barrier metal 33 includes, but is not restricted to: tantalum (Ta), tantalum nitride (TaN), titanium nitride (TiN), and tungsten nitride (WN).

Figure 4D:
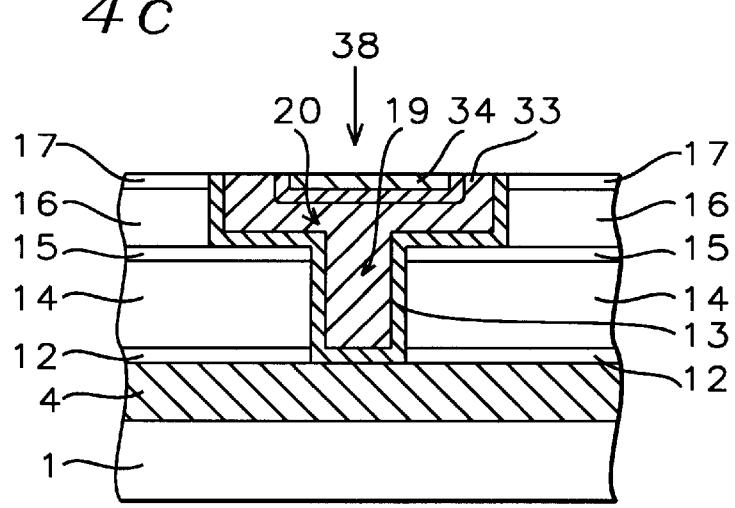

Referring to FIG. 4d, illustrated in cross-sectional drawing, provided is a continuation of the processing described above in FIG. 4c, describing the second embodiment of the present invention. Patterning of the Al—Cu film 34 and second barrier layer 33 is performed, wherein the Al—Cu and barrier layer is reactive ion etched back (RIE) using $Cl_2/BCl_3$ chemistry, stopping on the silicon nitride cap 17. Alternately, both the Al—Cu and barrier layer are polished back by chemical mechanical polishing (CMP), stopping on the silicon nitride cap 17. The end result of the second embodiment of this invention is an Al—Cu bond pad 38, shown in FIG. 4d. The top Al—Cu bond pad layer 38, centrally located, can now be soldered without the need for further passivation.

Figure 5A:
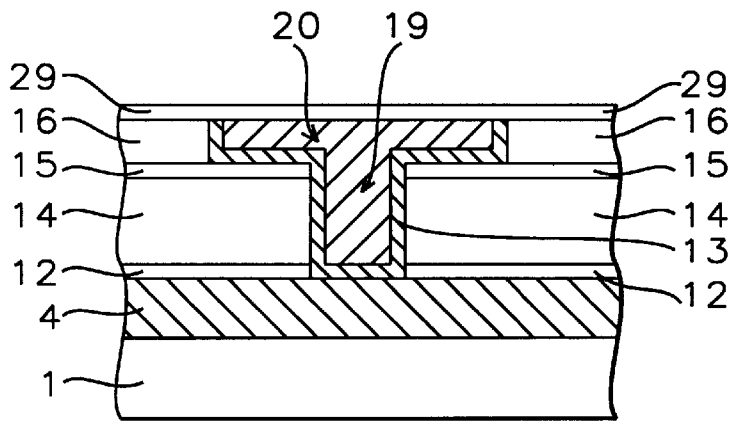
FIGS. 5A–5D, which in cross-sectional representation, illustrate the method of the third embodiment of the present invention, the formation of an Al—Cu top bond pad region for subsequent wire bonding.

Referring to FIGS. 5a–5d, which in cross-sectional representation illustrates the third embodiment of the present invention. More specifically, referring to FIG. 5a, illustrated in cross-sectional drawing, provided is the start of a copper damascene scheme with copper metallurgy, wiring underneath. Provided in FIG. 5a is a semiconductor substrate 1, preferably composed of mono-crystalline silicon with semiconductor device structures, such as, gate electrodes, source and drain regions, metal interconnects, damascene interconnects, contact holes and vias (not shown) may be formed in and on the semiconductor substrate. The semiconductor substrate may also contain dielectric and insulating layers (not shown), such as, silicon nitride and silicon dioxide. A copper interconnect 4 is deposited and patterned embedded within a provided insulating layer (not shown in Figs.). Although a single copper layer is depicted in FIG. 5a, it should be understood by those skilled in the art that the copper interconnect (4) could be part of a dual damascene or a single damascene interconnect scheme. In addition, two insulating layers of dielectric, a first intermetal dielectric (IMD) 14, and a second intermetal dielectric (IMD) 16, are deposited and patterned into a trench (gap) and via openings for copper bond pad and interconnect 20 and connect via 19. As shown in FIG. 5a, interposed between the first level of wiring 4 and first intermetal level dielectric 14, is a deposited and patterned passivation layer 12. In addition, interposed between first intermetal dielectric (IMD) 14 layer and the second intermetal dielectric (IMD) 16 layer, is a deposited and patterned etch stop (process option) layer 15. Also in FIG. 5a for completeness, provided are following layers: patterned passivation layer 12, a patterned etch stop (process option) layer 15, first conductive metal barrier layer 13, which is a trench and via liner, and a top passivating layer 29. The top passivating layer 29 includes, but is not restricted to, silicon nitride, silicon oxynitride, silicon carbide and boron nitride; but is preferably silicon nitride with a thickness from about 500 to 6000 Angstroms. The typical insulating dielectric material consists of, but is not restricted to, doped and undoped silicon oxide type compounds, or low dielectric constant organic polymers. After the deposition of both the first barrier metal layer 13 and copper into the trench 20 and via 19 regions, the excess copper and barrier metal are polished back by chemical mechanical polishing (CMP), stopping on the top of the second intermetal dielectric (IMD) layer 16. Next, as shown in FIG. 5a, the top passivating layer 29, preferably silicon nitride, is blanket deposited over the substrate and over the inlaid copper 20 and second intermetal dielectric (IMD) 16.

Figure 5B:
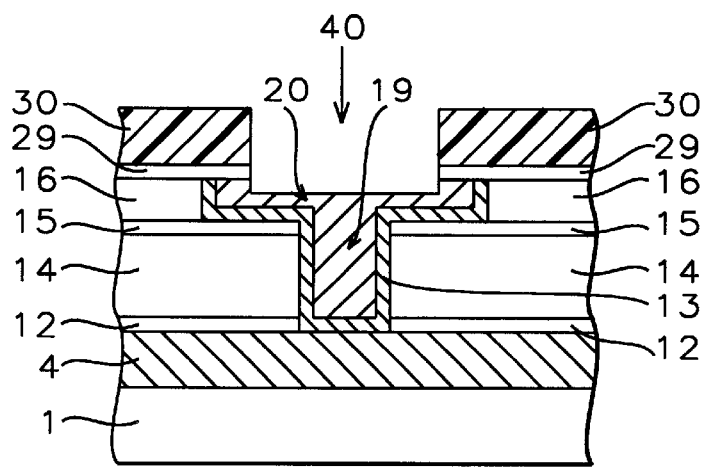

Referring to FIG. 5b, illustrated in cross-sectional drawing, provided is a continuation of the processing described above in FIG. 5a, describing the third embodiment of the present invention. A lithography step patterns photoresist 30 and the top passivating layer 29, silicon nitride, is reactive ion etched (RIE). In addition, the top copper 20 is reactive ion etched (RIE) or wet etched, to form a patterned recessed copper layer 40. The chemicals that are used for wet etching are, one or more of the following chemicals, to form a patterned recessed copper layer (40): dimethylsulfoxide (DMSO), carbon tetrachloride ($CCl_4$), hydrochloric acid (HCl), hydrofluoric acid (HF), acetic acid ($CH_3COOH$), ammonium fluoride ($NH_4F$), tetramethylammonium hydroxide (TMAH), tetraethylammonium hydroxide (TEAH), tetrapropylammonium hydroxide (TPAH), benzotriazole, surfactant and water. Some of the preferred etch solution mixtures include: $DMSO/CCl_4$, $TMAH/H_2O$, $NH_4F/CH_3COOH$, $HF/NH_4F/H_2O$, dilute HF, and $HF/NH_4F/H_2O$/surfactant. The amount of copper that is removed is ranges from about 100 to 8000 Angstroms.

Figure 5C:
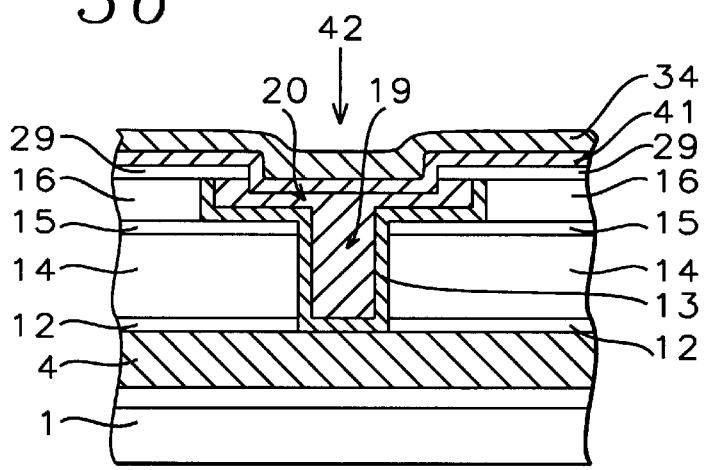

Referring to FIG. 5c, illustrated in cross-sectional drawing, provided is a continuation of the processing described above in FIG. 5b, describing the third embodiment of the present invention. The photoresist is stripped using an oxygen plasma ash step or using a solvent stripper. Next, a hydrogen or ammonia gas plasma is used to remove any copper oxide on the surface. Barrier metal 41, or second barrier layer, is deposited using physical vapor deposition (PVD), sputtering or chemical vapor deposition (CVD), to a thickness from about 20 to 5000 Angstroms. The second barrier metal layer (41) is composed of one or more of the following materials: tantalum (Ta), tantalum nitride (TaN), titanium nitride (TiN), and tungsten nitride (WN). Following the barrier metal deposition, a layer of Al—Cu alloy metal 34 is deposited to a thickness of from about 2,000 to 20,000 Angstroms, forming the start of an Al—Cu bonding pad region 42.

Figure 5D:
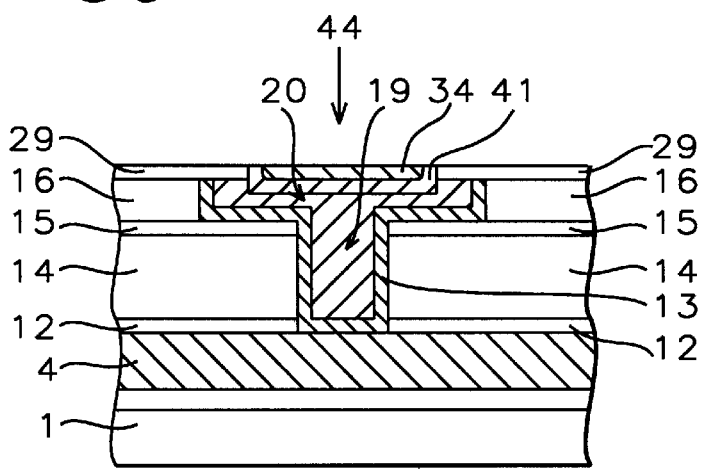

Referring to FIG. 5d, illustrated in cross-sectional drawing, provided is a continuation of the processing described above in FIG. 5c, describing the third embodiment of the present invention. Patterning of the Al—Cu film 34 and second barrier layer 41 is performed, wherein the Al—Cu and second barrier layer (41) is reactive ion etched back (RIE) using $Cl_2/BCl_3$ chemistry stopping on the silicon nitride passivation layer 29. Alternately, the Al—Cu and barrier layer are polished back using chemical mechanical polishing (CMP), stopping on the silicon nitride passivation layer 29. The end result of the third embodiment of this invention is an Al—Cu bond pad 44, shown in FIG. 5d. The top Al—Cu bond pad layer 44, centrally located, can now be soldered without the need for further passivation.

A summary of some of the processing details and specifications for Al—Cu alloy metal, that forms the Al—Cu bond pad layer, follow, and these process details apply to all the embodiments of the present invention, described earlier. For deposition of the Al—Cu or Al—Cu alloy metal by physical vapor deposition (PVD), the following sputtering conditions are: DC Magnetron sputtering with argon gas at pressures between about 0.1 to 10,000 mTorr, DC power from about 100 to 10,000 Watts, wafer temperature from about 25 to 500° C., argon gas flows from about 0.1 to 100 sccm. Following the Al—Cu deposition, an annealing step follows to enhance Al—Cu alloy formation. The annealing process details follow: gas ambient is a mixture of nitrogen and hydrogen gas or forming gas, temperature between about 200 to 500° C. at anneal times from about 20 to 60 minutes, and pressures between about 400 to 760 Torr (atmosphere).

Note, for good bond pad metallurgy in dual copper damascene processing, both pure metals, aluminum and copper, have the same face centered cubic (fcc) crystal structure and are close in atomic metallic radii size (coordination 12), for good, solid-solid solubility. Also, good electrical conductivity is good for both Cu and Al, Cu=0.94 and Al=0.50 (micro-Ohms)$^{-1}$, respectively, with almost a 2× factor better conductivity for pure copper than for pure aluminum. Therefore, copper rich alloys are better than aluminum rich alloys for conductivity. All equilibrium and non-equilibrium crystal structure phases in the aluminum copper phase diagram are possible from 0 to 100 weight percent (0 to 100 atomic percent) in the Al—Cu alloy layer, depending on the composition and temperature treatments, for good solid-solid state solution formation.

The compositions for the Al—Cu alloy metal, that form the Al—Cu bond pad layer, follow and these compositions apply to all the embodiments of the present invention, described earlier. The Al—Cu alloy metal compositions which are aluminum rich (on the extreme right side, Al side, of an Cu—Al phase diagram), given in weight percent are: Al ranges from 99.99 to 90.00 wt percent and for Cu ranges from 0.01 to 10.00 wt percent. Typical Al—Cu bond pad layer dimensions follow: bond pad size, width and length, ranges from approximately 1 micron by 1 micron square, to approximately 1000 microns by 1000 microns square. Note, the metal barrier layer underneath the Al—Cu prevents Al and Cu deleterious inter-diffusion between the bond pad and copper underneath.

The processes of the present invention fabricate Al—Cu wire bonding pads that have good adhesion properties (no metal interface separation/peel failures or interface fracture failures). Since there are a large statistical number of these structures, failure rates must be very low and reliability very high, as tested by gold wire bond pull tests. Temperature and humidity cycling tests indicate the robustness of the process and structure from stress-crack corrosion, peeling, interface failure, adhesion failures.

A "standard" gold wire bond pull test structure was used to evaluate the present invention's robust pad structures. For a standard pull test of metal adhesion strength (referred to as a manufacturing use test). An end portion gold wire with a Pb-Sn solder ball is bonded to the surface of the Al—Cu metal pad and tension applied thereto, at an angle of 90 degrees to the surface (to prevent shear). The diameter of the wire determines a standardized adhesion strength if the wire is broken first, at the tensile strength of the wire, before the pad is pulled away or peeled from the underlying structure. If the wire breaks (wire necking), it leaves a bonded portion called a nugget attached to the pad. It is considered that sufficient bonding has been achieved to develop adhesion that can withstand repeated thermal, humidity (T&H) and/or mechanical stress of the degree encountered during the testing and manufacturing. However, if a failure occurs between the metal and any interface in the structure (by peeling, fracture, interface failure) at a force less than that required to break the wire, adhesion is considered to be of a significantly low value which it will be deleterious to the reliability of the product. Wire (bond) pull tests were conducted to a large numbers of pads, to be statistically significant, to prove the robustness of the invention's processes to form Al—Cu bond pads for good adhesion properties.

In summary, for all three main embodiments of the present invention, the top Al—Cu bond pad layer can be soldered without the need for further passivation. At the aluminum copper alloy interface is protected from the pure copper below by the barrier layer.

While the invention has been particularly shown and described with reference to the preferred embodiments thereof, it will be understood by those skilled in the art that various changes in form and details may be made without departing from the spirit and scope of the invention.

What is claimed is:

1. A method for fabricating wire bond pads for applications in MOSFET and CMOS semiconductor devices using copper dual damascene, a method comprising:

providing a substrate, wafer or substrate module;

providing a first level of conducting wiring being defined and over said substrate;

depositing a passivating layer over the first level of conducting wiring;

depositing a first insulating layer of dielectric, forming a first intermetal dielectric layer (IMD), over the passivating layer;

depositing a second insulating layer of dielectric, forming a second intermetal dielectric layer (IMD), over the first insulating layer of dielectric (IMD);

patterning and etching the intermetal dielectric layers (IMD), and said passivating layer, forming a dual damascene trench/via opening, exposing regions of the first level of conducting wiring;

depositing and patterning a cap layer over the second intermetal dielectric layer (IMD);

depositing a first blanket conductive metal barrier layer or first barrier layer, over the patterned cap layer, and into the trench/via openings, and over said exposed regions of the first level of conducting wiring;

depositing a blanket copper layer over the first barrier layer, and filling the trench/via opening;

polishing back by chemical mechanical polishing (CMP) the excess copper and first barrier layer material, stopping on the cap layer, forming a dual damascene inlaid copper in the trench/via;

etching back selectively by wet etching the top layer of the inlaid copper within the trench/via, forming a recessed copper within the trench/via and partially recessed trench/via opening;

etching copper oxide on the top layer of the recessed copper within the trench/via, that may be present, by hydrogen or ammonia plasma gas treatment;

depositing a second blanket conductive metal barrier layer or second barrier layer, over the recessed copper within the trench/via, and over the patterned cap layer;

depositing a blanket layer of Al—Cu alloy over the second barrier layer, and filling the partially recessed trench/via opening;

annealing thermally with forming gas the layer of Al—Cu alloy, enhancing alloy formation;

polishing back by chemical mechanical polishing (CMP) the Al—Cu alloy and second barrier layer material, stopping on the cap layer, forming a region of inlaid Al—Cu alloy bond pad, over a copper dual damascene interconnect trench/via, suitable for wire bonding and soldering without further passivation.

2. The method of claim 1, wherein said substrate is a semiconductor or an IC module, with the semiconductor substrate composed of mono-crystalline silicon with semiconductor device structures, selected from the group consisting of, gate electrodes, source and drain regions, metal interconnects, damascene interconnects, contact holes and vias, formed in and on the semiconductor substrate.

3. The method of claim 1, wherein both first and second insulating layers of dielectric, intermetal dielectric layers (IMD), for dual damascene trench/via are selected from the group consisting of doped and undoped silicon dioxide, silicon oxide, low dielectric constant organic polymers.

4. The method of claim 1, wherein the Al—Cu alloy bond pad is over a dual damascene interconnect trench/via, that is filled with copper and lined with a diffusion barrier liner.

5. The method of claim 1, further comprising forming an etch stop layer on the first insulating layer of dielectric (IMD), for the purpose of forming a dual damascene trench/via opening.

6. The method of claim 1, wherein the passivating cap layer or cap layer is selected from the group consisting of, silicon nitride, silicon oxynitride, silicon carbide and boron nitride, with a thickness from approximately 500 to 6,000 Angstroms.

7. The method of claim 1, wherein the top layer of copper within the trench/via, forming recessed copper within the trench/via, is etched back selectively by wet etch using DMSO/$CCl_4$ solution, dimethylsulfoxide, carbon tetrachloride, in a temperature range from 20 to 150° C., for an etch rate range between 5 to 100 Angstroms per minute, in an etch time of between 1 to 60 minutes, for a copper removal between about 100 to 8000 Angstroms.

8. The method of claim 1, wherein the top layer of copper within the trench/via, forming recessed copper within the trench/via, is etched back selectively by wet etch using an etchant, selected from the group consisting of, hydrofluoric acid (HF), acetic acid ($CH_3COOH$), ammonium fluoride ($NH_4F$), tetramethylammonium hydroxide (TMAH), tetraethylammonium hydroxide (TEAH), tetrapropylammonium hydroxide (TPAH), benzotriazole, surfactant and water.

9. The method of claim 1, wherein the top layer of copper within the trench/via, forming recessed copper within the trench/via, is etched back selectively by wet etch, using preferred etch solution mixtures, that are selected from the group consisting of, $NH_4F/CH_3COOH$, $HF/NH_4F/H_2O$, $HF/NH_4F/H_2O$/surfactant, and $TMAH/H_2O$.

10. The method of claim 1, wherein the second barrier layer, in between the top Al—Cu alloy wire bond pad layer and the copper underneath, is selected from the group consisting of one or more of the following: tantalum (Ta) tantalum nitride (TaN), titanium nitride (TiN), and tungsten nitride (WN), deposited either by physical vapor deposition (PVD), or by chemical vapor deposition (CVD), for an approximate thickness from 20 to 5,000 Angstroms.

11. The method of claim 1, wherein a blanket layer of AlCu alloy metal is deposited over said second barrier layer by physical vapor deposition (PVD), sputtering, for a film thickness from about 2,000 to 20,000 Angstroms.

12. The method of claim 1, wherein a blanket layer of AlCu alloy metal is deposited over said second barrier layer by physical vapor deposition (PVD), sputtering, for a film thickness from about 2,000 to 20,000 Angstroms, using the following process conditions: DC Magnetron sputtering with argon gas at pressures between about 0.1 to 10,000 mTorr, DC power from about 100 to 10,000 Watts, wafer temperature from about 25 to 500° C., argon gas flows from about 0.1 to 100 sccm.

13. The method of claim 1, wherein the forming gas annealing the layer of Al—Cu alloy, enhancing alloy formation, consists of the following conditions: gas ambient is a mixture of nitrogen and hydrogen gas or forming gas, temperature between about 200 to 500° C. at anneal times from about 20 to 60 minutes, and pressures between about 400 to 760 Torr (atmosphere).

14. The method of claim 1, wherein the Al—Cu bond pad layer, for wire bonding over barrier layer and copper conducting interconnect/via, consists of Al—Cu alloys with compositions which are aluminum rich, consisting of Al metal ranging from about 99.99 to 90.00 wt percent, and Cu metal ranging from 0.01 to 10.00 wt percent.

15. The method of claim 1, wherein the Al—Cu bond pad layer, for wire bonding over barrier layer and copper conducting interconnect/via, consists of the following dimensions: bond pad size, width and length, ranges from approximately 1 micron by 1 micron square, to approximately 1000 microns by 1000 microns, square.

16. The method of claim 1, wherein the Al—Cu bond pad layer and second barrier layer are centrally patterned and formed by either an reactive ion etch (RIE) back using $Cl_2/BCl_3$ or the excess Al—Cu and second barrier material are removed by chemical mechanical polishing (CMP), and for both methods stopping on the silicon nitride cap layer.

17. The method of claim 1, wherein the Al—Cu alloy bond pad is planarized by removing excess conducting material, by a method selected from the group consisting of: planarization by chemical mechanical polishing (CMP), milling, ion milling, and/or etching, leaving only the Al—Cu that is on the copper dual damascene inlaid structures, that include trench/via and interconnect portions, stopping on the silicon nitride cap layer.

18. The method of claim 1, wherein the Al—Cu alloy bond pad, over a copper dual damascene interconnect trench/via, are fabricated for MOSFET and CMOS devices, for both memory and logic device applications.

19. A method for fabricating wire bond pads for applications in MOSFET and CMOS semiconductor devices using copper dual damascene, a method comprising:

providing a substrate, wafer or substrate module;

providing a first level of conducting wiring being defined and over said substrate;

depositing a passivating layer over the first level of conducting wiring;

depositing a first insulating layer of dielectric, forming a first intermetal dielectric layer (IMD), over the passivating layer;

depositing a second insulating layer of dielectric, forming a second intermetal dielectric layer (IMD), over the first insulating layer of dielectric (IMD);

patterning and etching the intermetal dielectric layers (IMD), and said passivating layer, forming a dual damascene trench/via opening, exposing regions of the first level of conducting wiring;

depositing and patterning a cap layer over the second intermetal dielectric layer (IMD);

depositing a first blanket conductive metal barrier layer or first barrier layer, over the patterned cap layer, and into the trench/via openings, and over said exposed regions of the first level of conducting wiring;

depositing a blanket copper layer over the first barrier layer, and filling the trench/via openings;

polishing back by chemical mechanical polishing (CMP) the excess copper and first barrier layer material, stopping on the cap layer, forming a dual damascene inlaid copper interconnect trench/via;

forming a photoresist over the inlaid copper and cap layer;

patterning the photoresist making an exposed opening over a portion of the inlaid copper;

etching back by wet etching the top layer of the exposed portion of the inlaid copper within the trench/via, forming a partially recessed copper region or portion within the trench/via and forming a partially recessed trench/via opening;

stripping the photoresist by oxygen plasma ashing or solvent stripper;

etching copper oxide on the top layer of the copper in the recessed copper region within the trench/via, that may be present, by hydrogen or ammonia plasma gas treatment;

depositing a second blanket conductive metal barrier layer or second barrier layer, over said copper and said recessed copper region within the trench/via, and over the patterned cap layer;

depositing a blanket layer of Al—Cu alloy over the second barrier layer, and filling the partially recessed trench/via opening;

annealing thermally with forming gas the layer of Al—Cu alloy, enhancing alloy formation;

polishing back by chemical mechanical polishing (CMP) the Al—Cu alloy and second barrier layer material, stopping on the cap layer, forming a centrally located region of inlaid Al—Cu alloy bond pad, over a copper dual damascene interconnect trench/via, suitable for wire bonding and soldering without further passivation.

20. The method of claim 19, wherein said substrate is a semiconductor or an IC module, with the semiconductor substrate composed of mono-crystalline silicon with semiconductor device structures, selected from the group consisting of, gate electrodes, source and drain regions, metal interconnects, damascene interconnects, contact holes and vias, formed in and on the semiconductor substrate.

21. The method of claim 19, wherein both first and second insulating layers of dielectric, intermetal dielectric layers (IMD), for dual damascene trench/via are selected from the group consisting of doped and undoped silicon dioxide, silicon oxide, low dielectric constant organic polymers.

22. The method of claim 19, wherein the Al—Cu alloy bond pad is over a dual damascene interconnect trench/via, that is filled with copper and lined with a diffusion barrier liner.

23. The method of claim 19, further comprising forming an etch stop layer on the first insulating layer of dielectric (IMD), for the purpose of forming a dual damascene trench/via opening.

24. The method of claim 19, wherein the passivating cap layer or cap layer is selected from the group consisting of, silicon nitride, silicon oxynitride, silicon carbide and boron nitride, with a thickness from approximately 500 to 6,000 Angstroms.

25. The method of claim 19, wherein the top layer of copper within the trench/via, forming recessed copper within the trench/via, is etched back by wet etch using an etchant, selected from the group consisting of, one or more of the following chemicals: dimethylsulfoxide (DMSO), carbon tetrachloride ($CCl_4$), hydrochloric acid (HCl), hydrofluoric acid (HF), acetic acid ($CH_3COOH$), ammonium fluoride ($NH_4F$), tetramethylammonium hydroxide (TMAH), tetraethylammonium hydroxide (TEAH), tetrapropylammonium hydroxide (TPAH), benzotriazole, surfactant and water, for a copper removal between about 100 to 8000 Angstroms.

26. The method of claim 19, wherein the top layer of copper within the trench/via, forming recessed copper within the trench/via, is etched by wet etch, using preferred etch solution mixtures, that are selected from the group consisting of: $DMSO/CCl_4$, $TMAH/H_2O$, $NH_4F/CH_3COOH$, $HF/NH_4F/H_2O$, dilute HF, and $HF/NH_4F/H_2O$/surfactant, for a copper removal between about 100 to 8000 Angstroms.

27. The method of claim 19, wherein the second barrier layer, in between the top Al—Cu alloy wire bond pad layer and the copper underneath, is selected from the group consisting of one or more of the following: tantalum (Ta), tantalum nitride (TaN), titanium nitride (TiN), and tungsten nitride (WN), deposited either by physical vapor deposition (PVD), or by chemical vapor deposition (CVD), for an approximate thickness from 20 to 5,000 Angstroms.

28. The method of claim 19, wherein a blanket layer of AlCu alloy metal is deposited over said second barrier layer by physical vapor deposition (PVD), sputtering, for a film thickness from about 2,000 to 20,000 Angstroms.

29. The method of claim 19, wherein a blanket layer of AlCu alloy metal is deposited over said second barrier layer by physical vapor deposition (PVD), sputtering, for a film thickness from about 2,000 to 20,000 Angstroms, using the following process conditions: DC Magnetron sputtering with argon gas at pressures between about 0.1 to 10,000 mTorr, DC power from about 100 to 10,000 Watts, wafer temperature from about 25 to 500° C., argon gas flows from about 0.1 to 100 sccm.

30. The method of claim 19, wherein the forming gas annealing the layer of Al—Cu alloy, enhancing alloy formation, consists of the following conditions: gas ambient is a mixture of nitrogen and hydrogen gas or forming gas, temperature between about 200 to 500° C. at anneal times from about 20 to 60 minutes, and pressures between about 400 to 760 Torr (atmosphere).

31. The method of claim 19, wherein the Al—Cu bond pad layer, for wire bonding over barrier layer and copper conducting interconnect/via, consists of Al—Cu alloys with compositions which are aluminum rich, consisting of Al metal ranging from about 99.99 to 90.00 wt percent, and Cu metal ranging from 0.01 to 10.00 wt percent.

32. The method of claim 19, wherein the Al—Cu bond pad layer, for wire bonding over barrier layer and copper conducting interconnect/via, consists of the following dimensions: bond pad size, width and length, ranges from approximately 1 micron by 1 micron square, to approximately 1000 microns by 1000 microns, square.

33. The method of claim 19, wherein the Al—Cu bond pad layer and second barrier layer are centrally patterned and formed by either an reactive ion etch (RIE) back using $Cl_2/BCl_3$ or the excess Al—Cu and second barrier material are removed by chemical mechanical polishing (CMP), and for both methods stopping on the silicon nitride cap layer.

34. The method of claim 19, wherein the Al—Cu alloy bond pad is planarized by removing excess conducting material, by a method selected from the group consisting of: planarization by chemical mechanical polishing (CMP), milling, ion milling, and/or etching, leaving only the Al—Cu that is on the copper dual damascene inlaid structures, that include trench/via and interconnect portions, stopping on the silicon nitride cap layer.

35. The method of claim 19, wherein the Al—Cu alloy bond pad, over a copper dual damascene interconnect trench/via, are fabricated for MOSFET and CMOS devices, for both memory and logic device applications.

36. A method for fabricating wire bond pads for applications in MOSFET and CMOS semiconductor devices using copper dual damascene, a method comprising:

providing a substrate, wafer or substrate module;

providing a first level of conducting wiring being defined and over said substrate;

depositing a first passivating layer over the first level of conducting wiring;

depositing a first insulating layer of dielectric, forming a first intermetal dielectric layer (IMD), over the first passivating layer;

depositing a second insulating layer of dielectric, forming a second intermetal dielectric layer (IMD), over the first insulating layer of dielectric (IMD);

patterning and etching the intermetal dielectric layers (IMD), and said passivating layer, forming a dual damascene trench/via opening, exposing regions of the first level of conducting wiring;

depositing a first blanket conductive metal barrier layer or first barrier layer, into the trench/via openings, and over said exposed regions of the first level of conducting wiring;

depositing a blanket copper layer over the first barrier layer, and filling the trench/via openings;

polishing back by chemical mechanical polishing (CMP) the excess copper and first barrier layer material, stopping on the second intermetal dielectric layer (IMD), forming dual damascene inlaid copper interconnect trench/via;

depositing a second passivating layer or top passivating layer over the inlaid copper and over the second intermetal dielectric layer (IMD);

forming a photoresist over the inlaid copper and top passivating layer;

patterning the photoresist making an exposed opening over a portion of the inlaid copper;

etching by reactive ion etch (RIE) the exposed second passivating layer or top passivating layer, exposing the top layer of the inlaid copper within the trench/via;

etching back by reactive ion etching (RIE) or wet etching back the top layer of the exposed portion of the inlaid copper within the trench/via, forming a partially recessed copper region or portion within the trench/via and forming a partially recessed trench/via opening;

stripping the photoresist by oxygen plasma ashing or solvent stripper;

etching copper oxide on the top layer of the copper in the recessed copper region within the trench/via, that may be present, by hydrogen or ammonia plasma gas treatment;

depositing a second blanket conductive metal barrier layer or second barrier layer, over the partially recessed copper region, or recess copper, within the trench/via, and over the patterned second passivation layer or top passivation layer;

depositing a blanket layer of Al—Cu alloy over the second barrier layer, and filling the partially recessed trench/via opening;

annealing thermally with forming gas the layer of Al—Cu alloy, enhancing alloy formation;

polishing back by chemical mechanical polishing (CMP) the Al—Cu alloy and second barrier layer material stopping on said second passivating layer or top passivating layer, forming a centrally located region of inlaid Al—Cu alloy bond pad, over a copper dual damascene interconnect trench/via, suitable for wire bonding and soldering without further passivation.

37. The method of claim 36, wherein said substrate is a semiconductor or an IC module, with the semiconductor substrate composed of mono-crystalline silicon with semiconductor device structures, selected from the group consisting of, gate electrodes, source and drain regions, metal interconnects, damascene interconnects, contact holes and vias, formed in and on the semiconductor substrate.

38. The method of claim 36, wherein both first and second insulating layers of dielectric, intermetal dielectric layers (IMD), for dual damascene trench/via are selected from the group consisting of doped and undoped silicon dioxide, silicon oxide, low dielectric constant organic polymers.

39. The method of claim 36, wherein the Al—Cu alloy bond pad is over a dual damascene interconnect trench/via, that is filled with copper and lined with a diffusion barrier liner.

40. The method of claim 36, further comprising forming an etch stop layer on the first insulating layer of dielectric (IMD), for the purpose of forming a dual damascene trench/via opening.

41. The method of claim 36, wherein the second passivating layer or top passivating layer is selected from the group consisting of, silicon nitride, silicon oxynitride, silicon carbide and boron nitride, with a thickness from approximately 500 to 6,000 Angstroms.

42. The method of claim 36, wherein the top layer of copper within the trench/via, forming recessed copper within the trench/via, is etched back by wet etch using an etchant, selected from the group consisting of, one or more of the following chemicals: dimethylsulfoxide (DMSO), carbon tetrachloride (CCl$_4$), hydrochloric acid (HCl), hydrofluoric acid (HF), acetic acid (CH$_3$COOH), ammonium fluoride (NH$_4$F), tetramethylammonium hydroxide (TMAH), tetraethylammonium hydroxide (TEAH), tetrapropylammonium hydroxide (TPAH), benzotriazole, surfactant and water, for a copper removal between about 100 to 8000 Angstroms.

43. The method of claim 36, wherein the top layer of copper within the trench/via, forming recessed copper within the trench/via, is etched by wet etch, using preferred etch solution mixtures, that are selected from the group consisting of: DMSO/CCl$_4$, TMAH/H$_2$O, NH$_4$F/CH$_3$COOH, HF/NH$_4$F/H$_2$O, dilute HF, and HF/NH$_4$F/H$_2$O/surfactant, for a copper removal between about 100 to 8000 Angstroms.

44. The method of claim 36, wherein the second barrier layer, in between the top Al—Cu alloy wire bond pad layer and the copper underneath, is selected from the group consisting of one or more of the following: tantalum (Ta), tantalum nitride (TaN), titanium nitride (TiN), and tungsten nitride (WN), deposited either by physical vapor deposition (PVD), or by chemical vapor deposition (CVD), for an approximate thickness from 20 to 5,000 Angstroms.

45. The method of claim 36, wherein a blanket layer of AlCu alloy metal is deposited over said second barrier layer by physical vapor deposition (PVD), sputtering, for a film thickness from about 2,000 to 20,000 Angstroms.

46. The method of claim 36, wherein a blanket layer of AlCu alloy metal is deposited over said second barrier layer by physical vapor deposition (PVD), sputtering, for a film thickness from about 2,000 to 20,000 Angstroms, using the following process conditions: DC Magnetron sputtering with argon gas at pressures between about 0.1 to 10,000 mTorr, DC power from about 100 to 10,000 Watts, wafer temperature from about 25 to 500° C., argon gas flows from about 0.1 to 100 sccm.

47. The method of claim 36, wherein the forming gas annealing the layer of Al—Cu alloy, enhancing alloy formation, consists of the following conditions: gas ambient is a mixture of nitrogen and hydrogen gas or forming gas, temperature between about 200 to 500° C. at anneal times from about 20 to 60 minutes, and pressures between about 400 to 760 Torr (atmosphere).

48. The method of claim 36, wherein the Al—Cu bond pad layer, for wire bonding over barrier layer and copper conducting interconnect/via, consists of Al—Cu alloys with compositions which are aluminum rich, consisting of Al metal ranging from about 99.99 to 90.00 wt percent, and Cu metal ranging from 0.01 to 10.00 wt percent.

49. The method of claim 36, wherein the Al—Cu bond pad layer, for wire bonding over barrier layer and copper conducting interconnect/via, consists of the following dimensions: bond pad size, width and length, ranges from approximately 1 micron by 1 micron square, to approximately 1000 microns by 1000 microns, square.

50. The method of claim 36, wherein the Al—Cu bond pad layer and second barrier layer are centrally patterned and formed by either an reactive ion etch (RIE) back using Cl$_2$/BCl$_3$ or the excess Al—Cu and second barrier material are removed by chemical mechanical polishing (CMP), and for both methods stopping on said second passivating layer or top passivating layer.

51. The method of claim 36, wherein the Al—Cu alloy bond pad is planarized by removing excess conducting material, by a method selected from the group consisting of: planarization by chemical mechanical polishing (CMP), milling, ion milling, and/or etching, leaving only the Al—Cu that is on the copper dual damascene inlaid structures, that include trench/via and interconnect portions, stopping on said second passivating layer or top passivating layer.

52. The method of claim 36, wherein the Al—Cu alloy bond pad, over a copper dual damascene interconnect trench/via, are fabricated for MOSFET and CMOS devices, for both memory and logic device applications.

* * * * *